United States Patent
Roy et al.

(10) Patent No.: US 9,166,585 B2
(45) Date of Patent: Oct. 20, 2015

(54) LOW POWER INVERTER CIRCUIT

(71) Applicants: Amit Roy, Noida (IN); Zhihong Cheng, Suzhou (CN); Amit Kumar Dey, Noida (IN); Vijay Tayal, Noida (IN); Chetan Verma, Noida (IN)

(72) Inventors: Amit Roy, Noida (IN); Zhihong Cheng, Suzhou (CN); Amit Kumar Dey, Noida (IN); Vijay Tayal, Noida (IN); Chetan Verma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/463,673

(22) Filed: Aug. 20, 2014

(65) Prior Publication Data

US 2015/0102839 A1    Apr. 16, 2015

(30) Foreign Application Priority Data

Oct. 10, 2013 (CN) .......................... 2013 1 0666639

(51) Int. Cl.
  *H03K 19/003* (2006.01)
  *H03K 19/00* (2006.01)
  *H03K 19/017* (2006.01)
  *H03K 19/20* (2006.01)

(52) U.S. Cl.
  CPC .......... *H03K 19/0013* (2013.01); *H03K 19/003* (2013.01); *H03K 19/0016* (2013.01); *H03K 19/017* (2013.01); *H03K 19/01707* (2013.01); *H03K 19/20* (2013.01)

(58) Field of Classification Search
  CPC .................... H03K 19/0013; H03K 19/00361; H03K 17/04206; H03K 17/6872; H03K 19/017; H03K 19/01707; H03K 19/018521; H03K 19/20; H03K 5/01
  USPC ........................ 326/81, 83; 327/116, 175, 278
  See application file for complete search history.

(56) References Cited

U.S. PATENT DOCUMENTS

| | | | |
|---|---|---|---|
| 4,495,426 A | 1/1985 | Leach | |
| 6,087,886 A | 7/2000 | Ko | |
| 6,246,271 B1 * | 6/2001 | Takada et al. | 327/116 |
| 6,404,258 B2 * | 6/2002 | Ooishi | 327/278 |
| 6,686,773 B1 | 2/2004 | Dash | |
| 6,897,696 B2 * | 5/2005 | Chang | 327/175 |
| 7,176,722 B2 | 2/2007 | Oh | |
| 7,288,963 B2 * | 10/2007 | Nagata | 326/81 |
| 7,312,626 B2 | 12/2007 | Forbes | |
| 7,394,297 B2 | 7/2008 | Nagata | |

\* cited by examiner

*Primary Examiner* — Vibol Tan
(74) *Attorney, Agent, or Firm* — Charles E. Bergere

(57) ABSTRACT

A low power inverter circuit includes first and second transistors that receive an input signal at their gate terminals. The first and second transistors are connected by way of their source terminals to third and fourth transistors, respectively. The third and fourth transistors are connected in parallel with fifth and sixth transistors, respectively. The third and fourth transistors are continuously switched on, and the fifth and sixth transistors are controlled in such a way to reduce short circuit current flowing through the first and second transistors when the input signal transitions from one state to another.

12 Claims, 1 Drawing Sheet

LOW POWER INVERTER CIRCUIT

BACKGROUND OF THE INVENTION

The present invention relates generally electronic circuits, and more specifically, to an inverter circuit.

Recent years have witnessed an increased demand for miniature and high-performance electronic devices. This demand has been primarily addressed with the evolution of integrated circuits (ICs) designed using very large scale integration (VLSI). Using VLSI, a single IC can have hundreds of thousands of transistors. This is achieved by miniaturizing transistors to sizes on the order of about 50 nanometer (nm) or less.

Although, reduced transistor size leads to increased processing power, it also can lead to increased power consumption. Power is classified as either static or dynamic. Static power consumption may be determined by calculating a product of a supply voltage provided to a transistor of the IC and a magnitude of direct current (DC) that includes both through current and leakage current, while dynamic power consumption, which includes capacitive power consumption, is determined by calculating a product of a load capacitance, a square of the supply voltage, and a toggle frequency.

Additionally, dynamic power consumption also includes power dissipation resulting from short circuits in the ICs when transistors in an inverter circuit switch state. For example, when an inverter circuit that includes p-channel metal oxide semiconductor (PMOS) and n-channel metal oxide semiconductor (NMOS) transistors switches state, both PMOS and NMOS transistors conduct current for a short duration of time. This simultaneous conduction of current results in a short-circuit DC current of considerable magnitude that flows through both the PMOS and NMOS transistors when an output is around one half of the supply voltage. The short-circuit DC current does not contribute to switching the capacitive loads and results in short-circuit power dissipation.

Various inverter circuits have been designed to reduce short-circuit power consumption. FIG. 1 is a schematic circuit diagram of one such conventional inverter circuit 100. The inverter circuit 100 includes first and second transistors 102 and 104, first and second capacitors 106 and 108, first and second diodes 110 and 112, and first and second resistors 114 and 116.

First terminals of the first and second resistors 114 and 116 receive an input voltage $V_{in}$. The first terminal of the first resistor 114 is connected to a first terminal of the first diode 110 and a second terminal of the first resistor 114 is connected to a second terminal of the first diode 110. The first terminal of the second resistor 116 is connected to a second terminal of the second diode 112 and a second terminal of the second resistor 116 is connected to a first terminal of the second diode 112. The second terminals of the first and second resistors 114 and 116 are connected to first terminals of the first and second capacitors 106 and 108, respectively, and second terminals of the first and second capacitors 106 and 108 are connected to ground.

A source of the first transistor 102 is connected to a supply voltage $V_{dd}$, and a gate of the first transistor 102 is connected to the first terminal of the first capacitor 106. A source of the second transistor 104 is connected to ground, a gate of the second transistor 104 is connected to the first terminal of the second capacitor 108, and a drain of the second transistor 104 is connected to a drain of the first transistor 102.

The first diode 110 and the first resistor 114 are connected in parallel between an input terminal of the inverter circuit 100 (node at which $V_{in}$ is provided) and the gate of the first transistor 102, while the second diode 112 and the second resistor 116 are connected in parallel between the input terminal of the inverter circuit 100 and the gate of the second transistor 104. The first and second resistors 114 and 116 have a high resistance. Thus, the equivalent resistance of the first and second resistors 114 and 116 is reduced when either of the first and second diodes 110 and 112 is reverse-biased. This in turn increases a conductance for a conduction path between the input terminal of the inverter circuit 100 and the gates of the first and second transistors 102 and 104 when the diode is reverse-biased. However, when either of the first and second diodes 110 and 112 is forward-biased, the low resistance and high conductance for the conduction path between the input terminal of the inverter circuit 100 and the gates of the first and second transistors 102 and 104 remains undisturbed. Higher equivalent resistance when either of the first and second diodes 110 and 112 is reverse-biased slows the charging and discharging of the gates of the first and second transistors 102 and 104, which reduces short-circuit current and short-circuit power dissipation.

Although the inverter circuit 100 reduces short-circuit current and power dissipation, the magnitude of the dynamic current flowing through the inverter circuit 100 is high, which leads to an overall increase in dynamic power dissipation. Further, the slowing of the charging and discharging of the gates of the first and second transistors 102 and 104 leads to slow switching speed, which increases the transistor delay and degrades performance. Furthermore, the additional resistors and diodes, i.e., the first and second resistors 114 and 116 and the first and second diodes 110 and 112, increase on-chip area, which increases the overall cost of the IC.

Therefore, it would be advantageous to have an inverter circuit that has low short-circuit power consumption and fast switching, a small footprint, and overcomes the above-mentioned limitations of conventional inverter circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
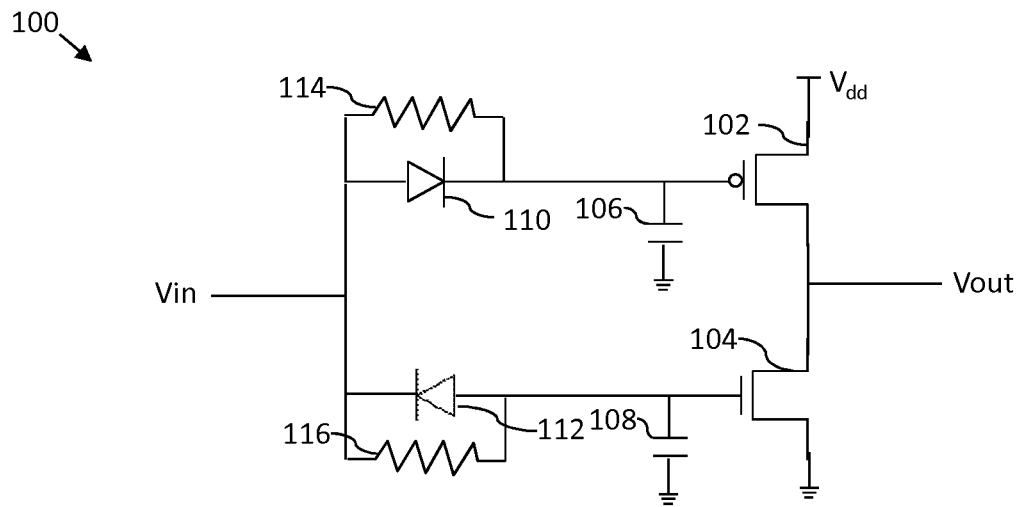
FIG. 1 is a schematic circuit diagram of a conventional inverter circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an inverter circuit is provided. The inverter circuit includes a first transistor having a source terminal for receiving a supply voltage, and a gate terminal shorted to ground; a second transistor having a source terminal for receiving the supply voltage, and a drain terminal connected to a drain terminal of the first transistor; a first inverter, connected to the drain terminals of the first and second transistors, for receiving an input signal and generating an output signal at an output terminal; a third transistor having a drain terminal connected to the first inverter, a source terminal shorted to ground, and a gate terminal for receiving the supply voltage; a fourth transistor having a drain terminal connected to the drain terminal of the third transistor, and a source terminal shorted to ground; and a second inverter having an input terminal connected to the output terminal of the first inverter for receiving the output signal, and an output terminal connected to gate terminals of the second and fourth transistors.

In another embodiment of the present invention, an inverter circuit is provided. The inverter circuit includes a first transistor having a source terminal for receiving a supply voltage, and a gate terminal shorted to ground; a second transistor having a source terminal for receiving the supply voltage, and a drain terminal connected to a drain terminal of the first transistor; and a first inverter. The first inverter includes a third transistor having a source terminal connected to the drain terminals of the first and second transistors, a gate terminal for receiving an input signal; and a fourth transistor having a drain terminal connected to a drain terminal of the third transistor, and a gate terminal connected to the gate terminal of the third transistor for receiving the input signal. An output signal is generated at the drain terminals of the third and fourth transistors. The inverter circuit further includes a fifth transistor having a drain terminal connected to a source terminal of the fourth transistor, a source terminal shorted to ground, a gate terminal for receiving the supply voltage; a sixth transistor having a drain terminal connected to the source and drain terminals of the fourth and fifth transistors, respectively, a source terminal shorted to ground; and a second inverter. The second inverter includes a seventh transistor having a source terminal for receiving the supply voltage, a gate terminal connected to the drain terminals of the third and fourth transistors for receiving the output signal; and an eighth transistor having a drain terminal connected to a drain terminal of the seventh transistor and to gate terminals of the second and sixth transistors, a gate terminal connected to the gate terminal of the seventh transistor for receiving the output signal, and a source terminal shorted to ground.

Various embodiments of the present invention provide an inverter circuit having low power consumption. The inverter circuit includes first and second transistors that receive an input signal at gate terminals thereof. The first and second transistors are connected, by way of source terminals thereof, to third and fourth transistors. The third and fourth transistors stay switched on continuously and are connected in parallel with fifth and sixth transistors, respectively, that have small threshold voltages (SVT), and therefore low resistances. The third and fourth transistors have high threshold voltages (HVT) and therefore high resistances. When the input signal is in a steady state, i.e., either logic zero or logic one, either of the third or fourth transistors is switched on based on whether the first or second transistors is switched on. For example, when the first transistor is switched on, the fifth transistor (that is connected in parallel with the third transistor) is switched on. Switching on of the fifth transistor puts the high resistance of third transistor in parallel with low resistance of the fifth transistor, thereby forming a low resistance conduction path by way of which the first transistor draws current when the input signal is in a steady state, thus lowering the dynamic power consumption of the inverter circuit.

When the input signal transitions from one state to another, the first and second transistors are simultaneously switched on for a brief time duration, thereby generating short-circuit current. During this time duration, the fifth and sixth transistors are controlled such that the flow of short-circuit current through a high resistance path that includes the first through fourth transistors is constrained. The high resistance path including first through fourth transistors has high resistances arranged in series, which lowers the magnitude of the short-circuit current to a large extent and reduces the short-circuit power dissipation. Since the fifth and sixth transistors are SVT transistors, the delay of the inverter circuit is not increased. Additionally, the fifth and sixth transistors are controlled using the seventh and eighth transistors that have W/L ratios about 0.12 times than that of the first and second transistors. Thus, the seventh and eighth transistors have minimal impact on on-chip area and on the overall power consumption of the inverter circuit.

Figure 2:
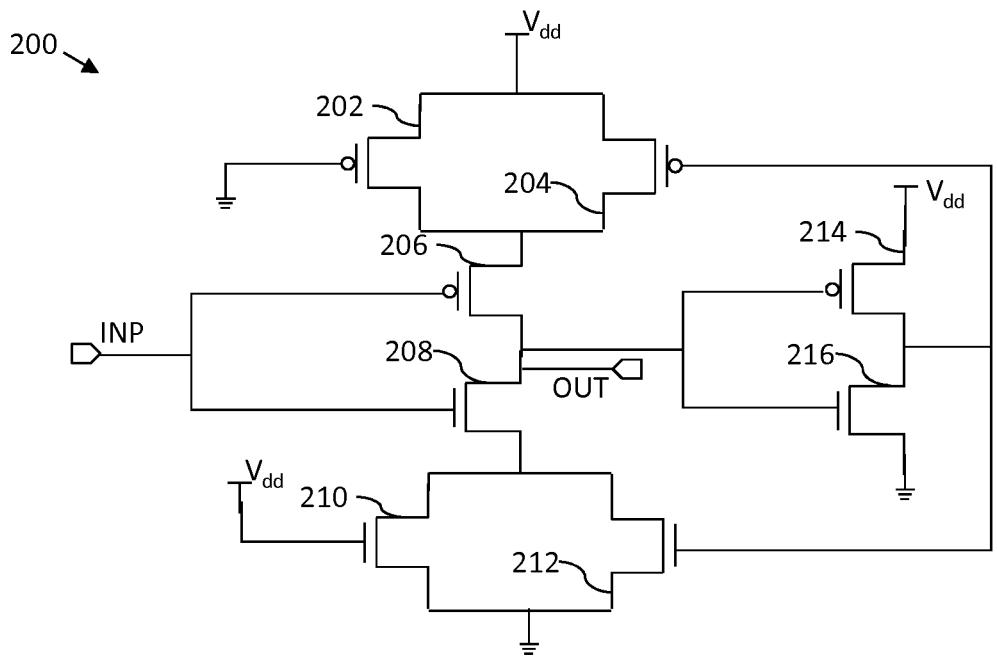
FIG. 2 is a schematic circuit diagram of an inverter circuit in accordance with an embodiment of the present invention.

Referring now to FIG. 2, a schematic circuit diagram of an inverter circuit 200 in accordance with an embodiment of the present invention is shown. The inverter circuit 200 includes first through eighth transistors 202-216.

The first transistor 202 has a source terminal connected to a supply voltage ($V_{dd}$) and a gate terminal connected to ground. The second transistor 204 has a source terminal also connected to the supply voltage $V_{dd}$, and a drain terminal connected to a drain terminal of the first transistor 202. The third transistor 206 has a source terminal connected to the drain terminals of the first and second transistors 202 and 204, and a gate terminal that receives an input signal INP. The fourth transistor 208 has a drain terminal connected to a drain terminal of the third transistor 206, and a gate terminal connected to the gate terminal of the third transistor 206 for receiving the input signal INP. An output signal (OUT) is generated at the drain terminals of the third and fourth transistors 206 and 208.

The fifth transistor 210 has a drain terminal connected to a source terminal of the fourth transistor 208, a gate terminal connected to the supply voltage $V_{dd}$, and a source terminal connected to ground. The sixth transistor 212 has a drain terminal connected to the source terminal of the fourth transistor 208, a gate terminal connected to a gate terminal of the second transistor 204, and a source terminal connected to ground.

The seventh transistor 214 has a source terminal connected to the supply voltage $V_{dd}$, and a gate terminal connected to the drain terminals of the third and fourth transistors 206 and 208 for receiving the output signal OUT. The eighth transistor 216 has a drain terminal connected to a drain terminal of the seventh transistor 214, and a gate terminal connected to the gate terminal of the seventh transistor 214 for receiving the output signal OUT. The drain terminals of the seventh and eighth transistors 214 and 216 also are connected to the gate terminals of the second and sixth transistors 204 and 212.

In an embodiment of the present invention, the first, second, third, and seventh transistors 202, 204, 206, and 214 are p-channel metal oxide semiconductor (PMOS) transistors and the fourth, fifth, sixth, and eight transistors 208, 210, 212, and 216 are n-channel metal oxide semiconductor (NMOS) transistors. In a preferred embodiment of the invention, the first, fifth, seventh, and eighth transistors 202, 210, 214, and 216 are high threshold voltage transistors (HVT) and the second, third, fourth, sixth transistors 204, 206, 208, and 212 are small threshold voltage (SVT) transistors. Also in a preferred embodiment of the invention, the first, second, fifth, sixth transistors 202, 204, 210, and 212 have W/L ratios that are about 0.5 times that of the third and fourth transistors 206 and 208 and the seventh and eighth transistors have W/L ratios that are about 0.12 times that of the third and fourth transistors 206 and 208.

In an example of operation of the inverter circuit 200, the input signal INP is at logic one and the output signal OUT is at logic zero. As a result, the third transistor 206 is switched off and the fourth transistor 208 is switched on. Since the gate of the first transistor 202 is shorted to ground and the gate of the fifth transistor 210 is connected to the supply voltage $V_{dd}$, the first and fifth transistors 202 and 210 are on. Further, since the output signal OUT is at logic zero, the seventh transistor 214 is switched on and the eighth transistor 216 is switched off. The switched on seventh transistor 214 pulls up voltages at the gates of the second and sixth transistors 204 and 212, which switches off the second transistor 204 and switches on the sixth transistor 212. Switching on of the sixth transistor 212 puts a high resistance of the already switched on fifth transistor 210 in parallel with a low resistance of the sixth transistor 212, which reduces an equivalent resistance of a current conduction path formed from the source of the fourth transistor 208 (that is switched on) to ground. This reduction in the resistance of the current conduction path reduces dynamic power consumption of the fourth transistor 208.

When the input signal INP begins to transition from logic one to logic zero, the third transistor 206 goes on and the fourth transistor 208 goes on. For a brief time period, i.e., when the input signal INP is transitioning, both the third and fourth transistors 206 and 208 conduct current.

Further, the transition of the input signal INP causes the output signal OUT to transition from logic zero to logic one. As a result, the seventh transistor 214 goes off and the eighth transistor goes on, which in turn causes the voltages at the gates of the second and sixth transistors 204 and 212 to be pulled down. This causes the second transistor 204 to go on and the sixth transistor 212 to go off. Thus, when the input signal INP transitions from logic one to logic zero, the second and sixth transistors 204 and 212 also undergo transition. As a result, a high-resistance conduction path from the supply voltage $V_{dd}$ to ground is formed including the first and fifth transistors 202 and 210 with high resistances and the third and fourth transistors 206 and 208 with low resistances. The high resistance conduction path formed during transition of the input signal INP causes the short-circuit current produced during this phase to be very low such that there is a reduction in the short-circuit power dissipation as compared to the inverter circuit 100.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An inverter circuit, comprising:
  a first transistor having a source terminal for receiving a supply voltage, and a gate terminal shorted to ground;
  a second transistor having a source terminal for receiving the supply voltage, and a drain terminal connected to a drain terminal of the first transistor;
  a first inverter, connected to the drain terminals of the first and second transistors, for receiving an input signal and generating an output signal at an output terminal;
  a third transistor having a drain terminal connected to the first inverter, a source terminal shorted to ground, and a gate terminal for receiving the supply voltage;
  a fourth transistor having a drain terminal connected to the drain terminal of the third transistor, and a source terminal shorted to ground; and
  a second inverter having an input terminal connected to the output terminal of the first inverter for receiving the output signal, and an output terminal connected to gate terminals of the second and fourth transistors.

2. The inverter circuit of claim 1, wherein the first inverter comprises:
  a fifth transistor having a source terminal connected to the drain terminals of the first and second transistors, and a gate terminal for receiving the input signal; and
  a sixth transistor having a drain terminal connected to a drain terminal of the fifth transistor, a gate terminal connected to the gate terminal of the fifth transistor for receiving the input signal, wherein the output signal is generated at the drain terminals of the fifth and sixth transistors, and a source terminal connected to the drain terminals of the third and fourth transistors.

3. The inverter circuit of claim 2, wherein the second inverter comprises:
  a seventh transistor having a source terminal for receiving the supply voltage, and a gate terminal connected to the drain terminals of the fifth and sixth transistors for receiving the output signal; and
  an eighth transistor having a drain terminal connected to a drain terminal of the seventh transistor and to gate terminals of the second and fourth transistors, a gate terminal connected to the gate terminal of the seventh transistor for receiving the output signal, and a source terminal shorted to ground.

4. The inverter circuit of claim 3, wherein the third, fourth, sixth, and eighth transistors are re-channel metal-oxide semiconductor (NMOS) transistors.

5. The inverter circuit of claim 3, wherein the first, second, fifth, and seventh transistors are p-channel metal-oxide semiconductor (PMOS) transistors.

6. The inverter circuit of claim 3, wherein the first, third, seventh, and eighth transistors are high threshold voltage transistors.

7. The inverter circuit of claim 3, wherein the second, fourth, fifth, and sixth transistors are low threshold transistors.

8. An inverter circuit, comprising:
  a first transistor having a source terminal for receiving a supply voltage, and a gate terminal shorted to ground;
  a second transistor having a source terminal for receiving the supply voltage, and a drain terminal connected to a drain terminal of the first transistor;
  a first inverter, comprising:
    a third transistor having a source terminal connected to the drain terminals of the first and second transistors, and a gate terminal for receiving an input signal; and
    a fourth transistor having a drain terminal connected to a drain terminal of the third transistor, and a gate terminal connected to the gate terminal of the third transistor for receiving the input signal, wherein an output signal is generated at the drain terminals of the third and fourth transistors;
  a fifth transistor having a drain terminal connected to a source terminal of the fourth transistor, a source terminal shorted to ground, and a gate terminal for receiving the supply voltage;
  aسsixth transistor having a drain terminal connected to the source and drain terminals of the fourth and fifth transistors, respectively, and a source terminal shorted to ground; and
  a second inverter, comprising:
    a seventh transistor having a source terminal for receiving the supply voltage, and a gate terminal connected to the drain terminals of the third and fourth transistors for receiving the output signal; and an eighth transistor having a drain terminal connected to a drain terminal of the seventh transistor and to gate terminals of the second and sixth transistors, a gate terminal connected to the gate terminal of the seventh transistor for receiving the output signal, and a source terminal shorted to ground.

9. The inverter circuit of claim 8, wherein the fourth, fifth, sixth, and eighth transistors are re-channel metal-oxide semiconductor (NMOS) transistors.

10. The inverter circuit of claim 8, wherein the first, second, third, and seventh transistors are p-channel metal-oxide semiconductor (PMOS) transistors.

11. The inverter circuit of claim 8, wherein the first, fifth, seventh, and eighth transistors are high threshold voltage transistors.

12. The inverter circuit of claim 8, wherein the second, third, fourth, and sixth transistors are low threshold transistors.

* * * * *